US008952748B2

(12) United States Patent
Guimaraes et al.

(10) Patent No.: US 8,952,748 B2
(45) Date of Patent: Feb. 10, 2015

(54) CIRCUIT AND METHOD FOR A MULTI-MODE FILTER

(71) Applicant: FutureWei Technologies, Inc., Plano, TX (US)

(72) Inventors: Homero Guimaraes, Schaumburg, IL (US); Matthew Richard Miller, Arlington Heights, IL (US)

(73) Assignee: FutureWei Technologies, Inc., Plano, TX (US)

( * ) Notice: Subject to any disclaimer, the term of this patent is extended or adjusted under 35 U.S.C. 154(b) by 0 days.

(21) Appl. No.: 13/872,727

(22) Filed: Apr. 29, 2013

(65) Prior Publication Data

US 2014/0266408 A1 Sep. 18, 2014

Related U.S. Application Data

(60) Provisional application No. 61/780,513, filed on Mar. 13, 2013.

(51) Int. Cl.
*H03K 17/16* (2006.01)
*H03K 17/687* (2006.01)
*H01L 29/92* (2006.01)
*G08C 19/00* (2006.01)
*H01L 49/02* (2006.01)

(52) U.S. Cl.
CPC ............... *G08C 19/00* (2013.01); *H01L 28/40* (2013.01)
USPC ........................... 327/554; 455/307; 333/185

(58) Field of Classification Search
None
See application file for complete search history.

(56) References Cited

U.S. PATENT DOCUMENTS

| 6,642,779 | B2* | 11/2003 | Easwaran et al. | 327/553 |
| 6,791,383 | B2* | 9/2004 | Chatterjee | 327/156 |
| 6,836,399 | B2* | 12/2004 | Lee et al. | 361/306.1 |
| 7,796,201 | B2* | 9/2010 | Yen | 349/38 |
| 8,044,712 | B2* | 10/2011 | Finocchiaro | 327/554 |
| 8,143,941 | B2* | 3/2012 | Park et al. | 327/553 |
| 8,394,696 | B2* | 3/2013 | Baumgartner et al. | 438/239 |
| 8,729,666 | B2* | 5/2014 | Stribley et al. | 257/532 |
| 2008/0230820 | A1* | 9/2008 | Maeda et al. | 257/296 |
| 2013/0257677 | A1* | 10/2013 | Jeong | 343/861 |

OTHER PUBLICATIONS

Xie, H., et al., "Single-Chip Multiband EGPRS and SAW-Less LTE WCDMA CMOS Receiver With Diversity," IEEE Transactions On Microwave Theory And Techniques, vol. 60, No. 5, May 2012, pp. 1390-1396.

* cited by examiner

*Primary Examiner* — Lincoln Donovan
*Assistant Examiner* — Terry L Englund
(74) *Attorney, Agent, or Firm* — Slater & Matsil, L.L.P.

(57) ABSTRACT

An embodiment integrated circuit includes a first capacitive element including a first metal-oxide-semiconductor (MOS) capacitor and a second capacitive element coupled in parallel with the first capacitive element, where the second capacitive element includes a second MOS capacitor. Also, the integrated circuit includes a third capacitive element coupled in parallel with the first capacitive element and the second capacitive element, where the third capacitive element includes a first metal-insulator-metal (MIM) capacitor and a fourth capacitive element coupled in parallel with the first capacitive element, the second capacitive element, and the third capacitive element, where the fourth capacitive element includes a second MIM capacitor.

19 Claims, 8 Drawing Sheets

CIRCUIT AND METHOD FOR A MULTI-MODE FILTER

This application claims the benefit of U.S. Provisional Application Ser. No. 61/780,513 filed on Mar. 13, 2013, and entitled "Circuit and Method for a Multi-Mode Filter," which application is incorporated herein by reference.

TECHNICAL FIELD

The present invention relates generally to electronic circuits and methods, and in particular to a circuit and a method for a multi-mode filter.

BACKGROUND

Cellular communications devices contain transceivers, such as radio frequency (RF) transceivers, used to receive and transmit radio frequency signals. An RF transceiver may include a baseband filter designed to filter the baseband bandwidth of a received RF signal. An example of a baseband filter is a differential biquad filter coupled with with a single pole filter. A transceiver may be integrated on a single chip capable of receiving and transmitting RF signals for a variety of communications standards, such as for global system for mobile Communications (GSM), wideband code division multiple access (WCDMA), long term evolution (LTE) time division synchronous code division multiple access (TD-SCDMA), enhanced data rates for GSM evolution (EDGE), and Institute of Electrical and Electronics Engineers (IEEE) Wi-Fi 802.11 a/b/g/n. These different communications standards have different baseband bandwidths, and therefore different requirements for filters.

SUMMARY OF THE INVENTION

In accordance with an embodiment, an integrated circuit includes a first capacitive element including a first metal-oxide-semiconductor (MOS) capacitor and a second capacitive element coupled in parallel with the first capacitive element, where the second capacitive element includes a second MOS capacitor. Also, the integrated circuit includes a third capacitive element coupled in parallel with the first capacitive element and the second capacitive element, where the third capacitive element includes a first metal-insulator-metal (MIM) capacitor and a fourth capacitive element coupled in parallel with the first capacitive element, the second capacitive element, and the third capacitive element, where the fourth capacitive element includes a second MIM capacitor.

In accordance with another embodiment, a circuit includes a first op-amp including a first input, a second input, and a first output, where the first input is coupled to a first node, where the second input is coupled to a second node and where the first output is coupled to a third node. Also, the circuit includes a first resistor coupled to the first node and to a fourth node and a first capacitive element coupled to the fourth node and to a fifth node, where the first capacitive element includes a first MOS capacitor and a first MIM capacitor coupled in parallel with the first MOS capacitor. Additionally, the circuit includes a second capacitive element coupled to the first node and to the third node, where the second capacitive element includes a second MOS capacitor and a second MIM capacitor coupled in parallel with the second MOS capacitor. The circuit also includes a second resistor coupled to the third node and to a sixth node and a second op-amp including a third input coupled to the sixth node, a fourth input coupled to a seventh node, and a second output coupled to an eighth node. Also, the circuit includes a third capacitive element coupled to the sixth node and to the eighth node, where the third capacitive element includes a third MOS capacitor and a third MIM capacitor coupled in parallel with the third MOS capacitor.

In accordance with an additional embodiment, a method of selecting a capacitance of a capacitive structure includes determining if a first capacitive element of the capacitive structure is selected, where the first capacitive element includes a first MOS capacitor and determining if a second capacitive element of the capacitive structure is selected, where the second capacitive element includes a second MOS capacitor, and where the second capacitive element is coupled in parallel with the first capacitive element. Also, the method includes determining if a third capacitive element of the capacitive structure is selected, where the third capacitive element includes a first MIM capacitor, and where the third capacitive element is coupled in parallel with the first capacitive element and with the second capacitive element and determining if a fourth capacitive element of the capacitive structure is selected, where the fourth capacitive element includes a second MIM capacitor, and where the fourth capacitive element is coupled in parallel with the first capacitive element, with the second capacitive element, and with the third capacitive element. Additionally, the method includes selecting one or more of the first, second, third, and fourth capacitive elements in accordance with the determinations.

In accordance with yet another embodiment, a method of manufacturing an integrated circuit includes forming a first capacitive element at a surface of a semiconductor substrate, forming a second capacitive element at the surface of the semiconductor substrate, and coupling the first capacitive element in parallel with the second capacitive element. Also, the method includes forming a third capacitive element in a metal layer overlying the surface of the semiconductor substrate and forming a fourth capacitive element in the metal layer overlying the surface of the semiconductor substrate. Additionally, the method includes coupling the third capacitive element in parallel with the first capacitive element and the second capacitive element and coupling the fourth capacitive element in parallel with the first capacitive element, with the second capacitive element, and with the third capacitive element.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

For 3G and 4G cellular transceivers, several wireless standards may be implemented on a single chip. The various standards require different baseband filter bandwidths, which may range from 200 KHz for Global System for Mobile Communications (GSM) to 20 MHZ for long term evolution (LTE)-40. Generally, large capacitors are used for the lower bandwidth filters and small capacitors are used for high bandwidth filters.

Figure 1:
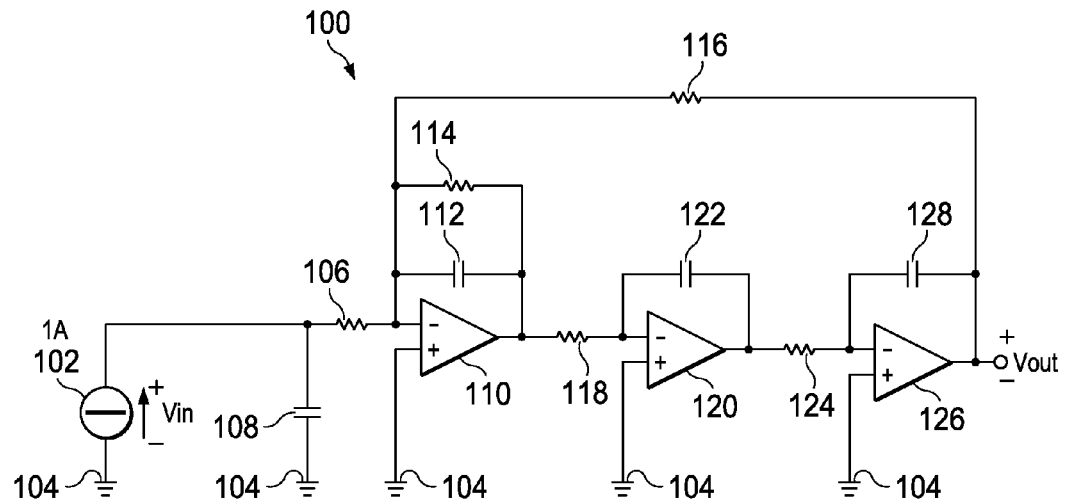
FIG. 1 illustrates an embodiment baseband filter.

A biquad or a biquad plus a real pole filter may be the main filter of a cellular baseband receiver. FIG. 1 illustrates circuit 100, an example of a current-driven biquad filter preceded by a single pole that may be used as a baseband filter in a transceiver. A biquad filter, or biquadratic filter, is a type of linear filter that implements a transfer function that is a ratio of two quadratic functions. Circuit 100 illustrates a low pass Tow-Thomas biquad filter. The natural frequency of the biquad part in circuit 100 is given by:

$$\omega_o = \frac{1}{\sqrt{R_{116}R_{118}C_{112}C_{122}}},$$

where $R_{116}$ is the resistance of resistor 116, $R_{118}$ is the resistance of resistor 118, $C_{112}$ is the capacitance of capacitor 112, and $C_{122}$ is the capacitance of capacitor 122. Therefore, the capacitance of capacitor 112 and the capacitance of 122 affect the critical frequency of circuit 100. For circuit 100 to be implemented as a multi-mode filter, capacitor 112 and capacitor 122 may be variable capacitors. The voltage gain of filter 100 (Vout/Vin) is given by:

$$G = \frac{-R_{116}}{R_{106}}.$$

The quality factor of the biquad part in circuit 100 is given by:

$$Q = \sqrt{\frac{R_{114}^2 C_{112}}{R_{116}R_{118}C_{122}}},$$

where $R_{114}$ is the resistance of resistor 114. The second order transfer function of circuit 100 is given by:

$$H(s) = \frac{G\omega_o^2}{s^2 + \frac{\omega_o}{Q}s + \omega_o^2}.$$

Circuit 100 contains three op-amps: op-amp 110, op-amp 120, and op-amp 126. Op-amp 126 inverts the output of op-amp 120, while op-amp 110 and op-amp 120 perform the filtering functions. The positive input of op-amp 110 is coupled to ground 104, while the negative input of op-amp 110 is coupled to resistor 106, which is coupled to current source 102 and capacitor 108. In an example, current source 102 is a 1 amp AC current source. Coupled between the negative input and the output of op-amp 110 in parallel are capacitor 112 and resistor 114. Additionally, coupled between the output of op-amp 110 and the negative input of op-amp 120 is resistor 118, while the positive input of op-amp 120 is connected to ground 104. Also, capacitor 122 is coupled between the negative input and the output of op-amp 120. Additionally, resistor 124 is coupled between the output of op-amp 120 and the negative input of op-amp 126. The positive input of op-amp 126 is coupled to ground 104, while resistor 128 is coupled between the negative input and the output of op-amp 126. Also, resistor 116 is coupled between the output of op-amp 126 and the negative input of op-amp 110. To adjust the frequency and the Q of circuit 100, the various resistors and capacitors may be implemented as variable resistors and capacitors that may be adjusted to alter the frequency and Q of circuit 100.

Figure 2:
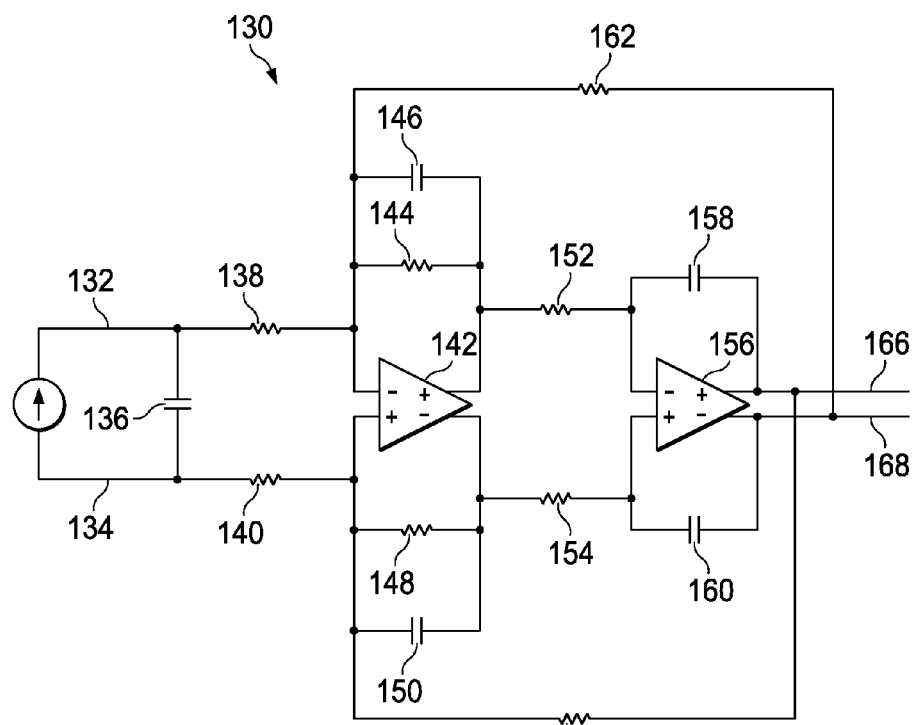
FIG. 2 illustrates an embodiment differential baseband filter.

A baseband filter in an RF receiver may be implemented as a differential filter. FIG. 2 illustrates circuit 130, a current-driven differential biquad filter with a single pole. Circuit 130 contains two fully differential op-amps, differential op-amp 142 and differential op-amp 156. Because of the inversion inherent in fully differential op-amps, only two op-amps are used in circuit 130, compared to the three op-amps in circuit 100. The natural frequency of the biquad part in circuit 130 is given by:

$$\omega_o = \frac{1}{\sqrt{R_{162}R_{152}C_{146}C_{158}}},$$

where $R_{162}$ is the resistance of resistor 162, $R_{152}$ is the resistance of resistor 152, $C_{158}$ is the capacitance of capacitor 158 and $C_{146}$ is the capacitance of capacitor 146. The gain of circuit 130 is given by:

$$G = \frac{-R_{162}}{R_{138}},$$

where $R_{162}$ is the resistance of resistor 162 and $R_{138}$ is the resistance of resistor 138.

Circuit 130 may be symmetric, where the top half of the circuit mirrors the bottom half of the circuit. In an example, capacitor 146 and capacitor 150 have equal capacitance, and capacitor 158 and capacitor 160 have equal capacitance, which may be adjustable to alter the natural frequency and the Q of the low pass filter. The resistance of the resistors and the capacitance of the capacitances may be adjustable so the natural frequency of circuit 130 may be adjusted to make circuit 130 a multi-mode filter. In one embodiment, the capacitors are switched in to compensate for the effect of tolerances on the filter cut-off frequencies, and the resistors are swapped to select the operating mode of the filter (e.g. LTE-40, LTE-20, GSM, etc.).

Resistor 138 is coupled between negative input 132 and the negative input of differential op-amp 142, while resistor 140 is coupled between positive input 134 and the positive input of differential op-amp 142. Additionally, capacitor 136 is coupled between negative input 132 and positive input 134. Also, resistor 144 and capacitor 146 are, in parallel, coupled between the negative input and the positive output of differential op-amp 142, while resistor 148 and capacitor 150 are coupled in parallel between the positive input and the negative output of differential op-amp 142. Resistor 152 is coupled between the positive output of differential op-amp 142 and the negative input of differential op-amp 156, and resistor 154 is coupled between the negative output of differential op-amp 142 and the positive input of differential op-amp 156. Also, capacitor 158 is coupled between the negative input of differential op-amp 156 and the positive output of differential op-amp 156, while capacitor 160 is coupled between the positive input of differential op-amp 156 and the negative output of differential op-amp 156. Additionally, resistor 162 is coupled between the negative output of differential op-amp 156 and the negative input of differential op-amp 142, and resistor 164 is coupled between the positive output of differential op-amp 156 and the positive input of differential op-amp 142. Negative output 166 is coupled to the positive output of op-amp 156, and positive output 168 is coupled to the negative output of op-amp 156.

Figure 3:
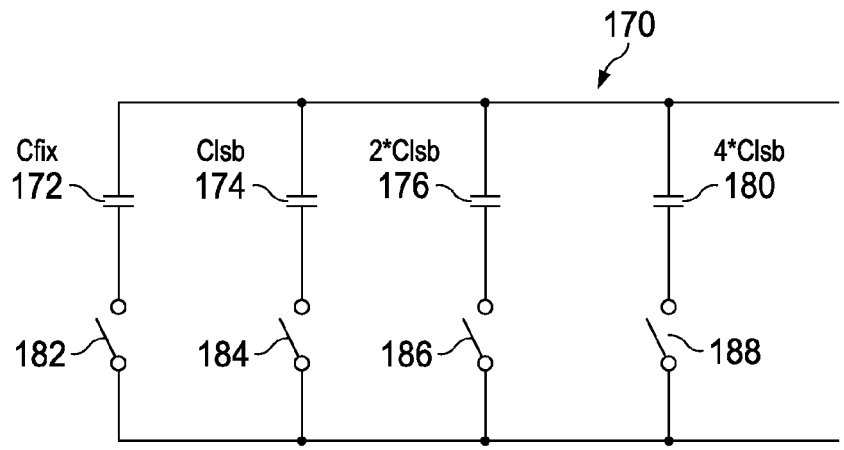
FIG. 3 illustrates an embodiment capacitor circuit.

FIG. 3 illustrates circuit 170, which may be used as a variable capacitor, for example in circuit 130. Switch 182 connects and disconnects capacitor 172, switch 184 connects and disconnects capacitor 174, switch 186 connects and disconnects capacitor 176, and switch 188 connects and disconnects capacitor 180. In an example, switch 182 is omitted. Capacitor 172 may be a fixed capacitance (Cfix), which may be always connected. Capacitor 174 has a capacitance of the least significant bit (Clsb), while capacitor 176 has a capacitance of a multiple of Clsb, and capacitor 180 has a capacitance of a multiple of Clsb. For example, capacitor 176 may have a capacitance of twice the capacitance of capacitor 174, and capacitor 180 has a capacitance of four times the capacitance of capacitor 174. Capacitor 174, capacitor 176, and capacitor 180 may be independently connected or disconnected in parallel with capacitor 172 to obtain the desired capacitance for circuit 170. Although only four capacitors are pictured in circuit 170, additional capacitors may be connected in parallel with capacitor 172, with the capacitance of each successive capacitor being a multiple of the capacitance of the previous capacitor. As the filter progresses from a wide bandwidth filter mode (i.e. LTE-40) to a narrow bandwidth filter mode (i.e. GSM), the value of each of Cfix and Clsb are increased by adding extra capacitors to obtain the appropriate value for a given mode. Thus all the capacitors deployed in the high-bandwidth modes are re-used in the lower bandwidth modes.

Figure 4:
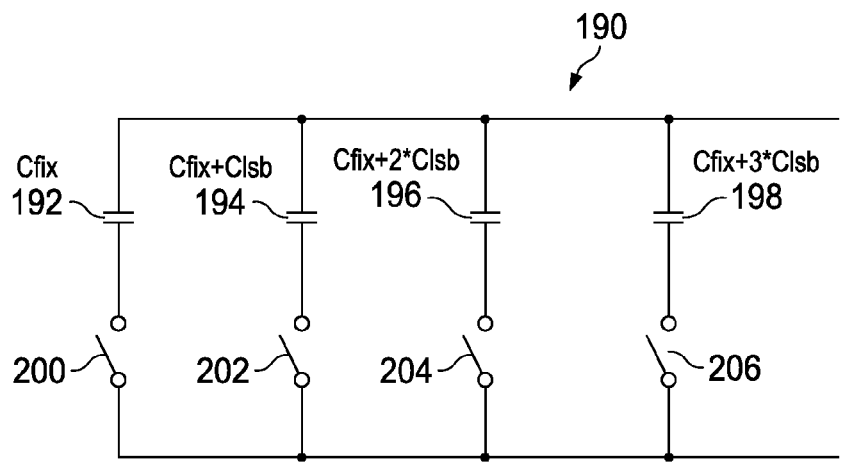
FIG. 4 illustrates another embodiment capacitor circuit.

In a multi-mode filter for an RF transceiver, two bandwidths may be so close that the capacitor needed to implement Clsb in circuit 170 is too small to be practically implemented. FIG. 4 illustrates circuit 190 that has a capacitance that can be adjusted to be close together without requiring a capacitor to have a capacitance of Clsb. As in circuit 170, circuit 190 has four capacitors connected at one end (capacitor 192, capacitor 194, capacitor 196, and capacitor 198) with a switch connected in series with each capacitor (switch 200, switch 202, switch 204, and switch 206) such that the capacitors may be independently connected to obtain the desired capacitance. In an example, switch 200 is omitted. However, circuit 190 is configured so that only one capacitor may be connected at a time. Capacitor 192 has a capacitance of CFix, capacitor 194 has a capacitance of Cfix+Clsb, capacitor 196 has a capacitance of Cfix+N*Clsb, and capacitor 198 has a capacitance of Cfix+M*Clsb, where N and M are integers. In an example, N is 2 and M is 3. This structure can be expanded to include more capacitors, depending on the filter cut-off frequency accuracy desired. In an example we use 16 capacitors with 4 bit binary tuning words.

Figure 5:
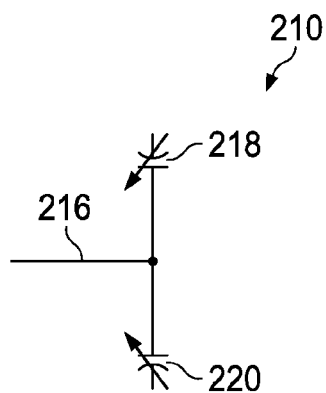
FIG. 5 illustrates an embodiment metal-oxide-semiconductor (MOS) capacitor circuit.

Variable capacitors used in circuit 170 and circuit 190 may be implemented as metal-oxide-semiconductor (MOS) capacitors. MOS capacitors have a small area and may have a small capacitance which facilitates small steps in capacitance, which is very useful in the implementation of higher bandwidth filters where we need small capacitance steps. However, MOS capacitors have linearity and leakage issues, especially for larger sized capacitors with a higher capacitance. This poses a problem if they are used in the lower bandwidth modes (i.e. GSM) where the capacitor values are larger. FIG. 5 illustrates circuit 210 showing a configuration with MOS capacitors. To reduce the effects of the non-linearity of the MOS capacitors, a pair of capacitors, capacitor 218 and capacitor 220 are connected back-to-back, with central terminal 216 biased to a power supply voltage. The two differential paths may be biased at half the power supply voltage. This differential operation compensates for the non-linearity of the individual capacitors.

Figure 6:
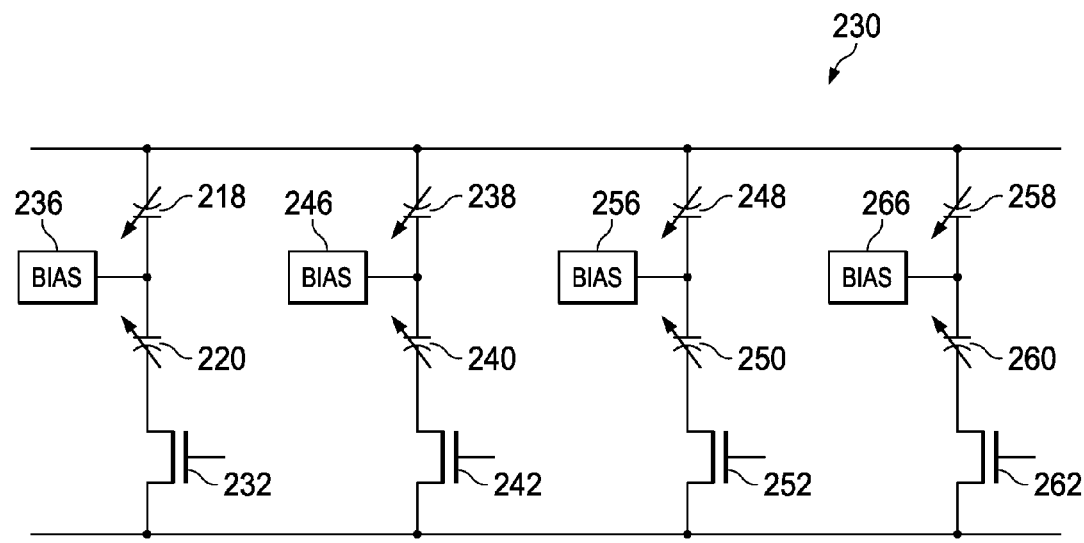
FIG. 6 illustrates another embodiment MOS capacitor circuit.

The back-to-back MOS capacitors may be configured in a binary tree, such as the binary trees illustrated by circuit 170 and circuit 190. FIG. 6 illustrates circuit 230, having back-to-back MOS capacitors connected in a parallel structure with a switch in series with the pairs of MOS capacitors. Capacitor 218 and capacitor 220 are biased with bias 236 and switched with switch 232, capacitor 238 and capacitor 240 are biased with bias 246 and controlled by switch 242, capacitor 248 and capacitor 250 are biased by bias 256 and controlled with switch 252, and capacitor 258 and capacitor 260 are biased by bias 266 and controlled by switch 262.

Figure 7:
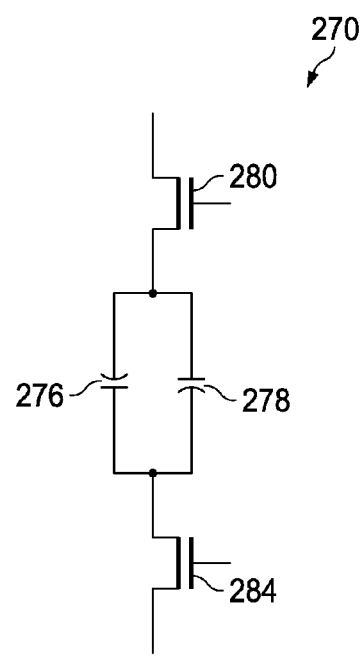
FIG. 7 illustrates an embodiment metal-insulator-metal (MIM) capacitor circuit.

Metal-insulator-metal (MIM) capacitors may also be used as the variable capacitors. MIM capacitors are very linear, and have low leakage, but have a large area, and are difficult to implement for a small capacitor size. However, MIM capacitors are useful in implementing the lower bandwidth modes where we use large capacitance values and large capacitance steps. To balance the parasitic capacitances between two different paths of MIM capacitors, an anti-parallel connection may be implemented, as shown by circuit 270 in FIG. 7. MIM capacitor 276 is connected anti-parallel to MIM capacitor 278. Switch 280 and switch 284 are both connected to opposite ends of the anti-parallel configuration. Circuit 270 does not include a bias network. In another example, capacitor 276 and capacitor 278 are MOS capacitors. When using MOS capacitors, the capacitors in circuit 270 may have less area than the capacitors in circuit 210.

Figure 8:
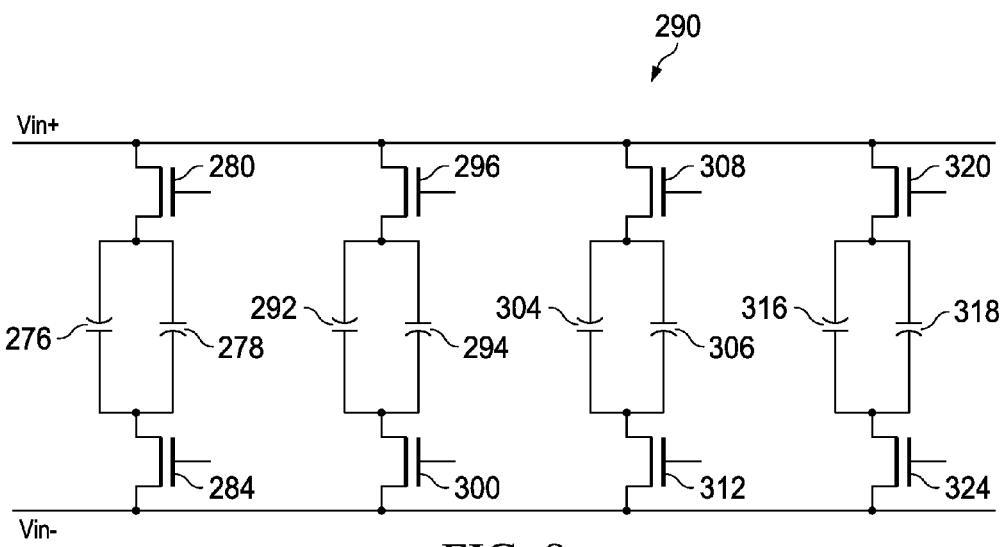
FIG. 8 illustrates an embodiment MIM capacitor circuit.

FIG. 8 illustrates circuit 290, which shows pairs of MIM capacitors in anti-parallel configurations forming a capacitor tree. MIM capacitor 276 and MIM capacitor 278 are connected to switch 280 and switch 284, MIM capacitor 292 and MIM capacitor 294 are connected to switch 296 and switch 300, MIM capacitor 304 and MIM capacitor 306 are connected to switch 308 and switch 312, and MIM capacitor 316 and MIM capacitor 318 are connected to switch 320 and switch 324.

MOS capacitors are good for a high bandwidth filter with small capacitors with small capacitances, because leakage is less of a concern. MIM capacitors are good for small bandwidth filters with large capacitors with large capacitance steps. Table 1 below, illustrates the capacitance values, in picofarads, for various communications transceivers for capacitor 108, capacitor 112, and capacitor 122 in Circuit 100. The capacitance is dominated by the GSM/EDGE filter and the LTE-1.4 filter.

TABLE 1

|  | LTE-40 | LTE-20 | WCDMA-3C | WCDMA-2C | LTE-10 | LTE-5 | WCDMA-SC | LTE-1.4 | GSM/EDGE |
| --- | --- | --- | --- | --- | --- | --- | --- | --- | --- |
| Capacitor 108 | 2.709 | 8.322 | 8.008 | 12.13 | 17.51 | 36.90 | 31.25 | 66.85 | 246.35 |
| Capacitor 112 | 1.963 | 4.789 | 4.789 | 8.833 | 8.794 | 19.86 | 19.82 | 41.81 | 198.5 |
| Capacitor 122 | 1.138 | 2.395 | 2.709 | 4.986 | 5.025 | 6.085 | 6.124 | 12.84 | 55.86 |
| Total | 5.81 | 15.51 | 15.51 | 25.9 | 31.33 | 62.85 | 57.20 | 121.5 | 500.08 |

Figure 9:
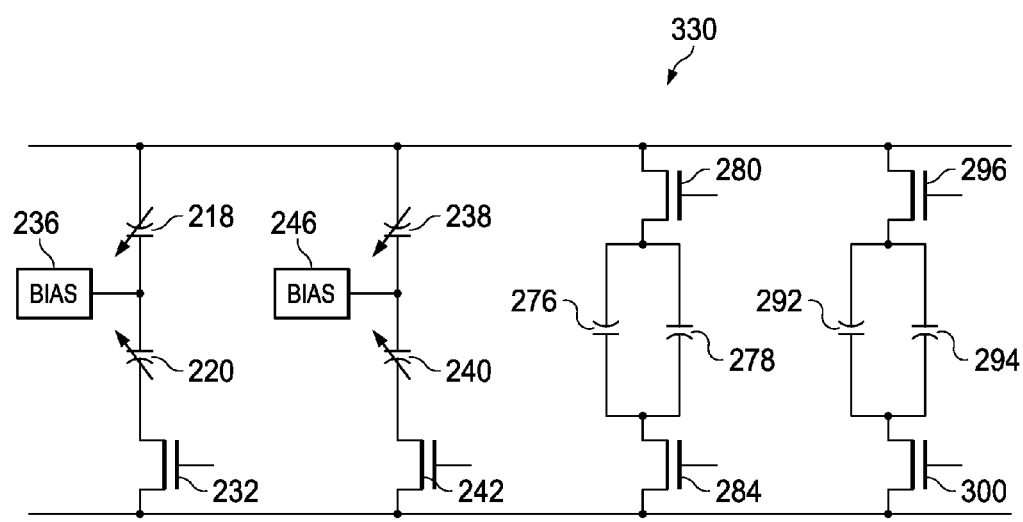
FIG. 9 illustrates an embodiment MOS and MIM capacitor circuit.

In an embodiment, large capacitors are implemented as MIM capacitors in parallel with small capacitors implemented as MOS capacitors. FIG. 9 illustrates circuit 330, which contains both MOS capacitors and MIM capacitors in parallel arrangements. MOS capacitors 218, 220, 238, and 240 are connected in parallel with MIM capacitors 276, 278, 292, and 294. The MOS capacitors are switched in during the large bandwidth modes, and the MIM capacitors are switched in when in the lower bandwidth modes. Therefore, the best properties of each capacitor are utilized, so we can have a better filter shape accuracy.

Figure 10:
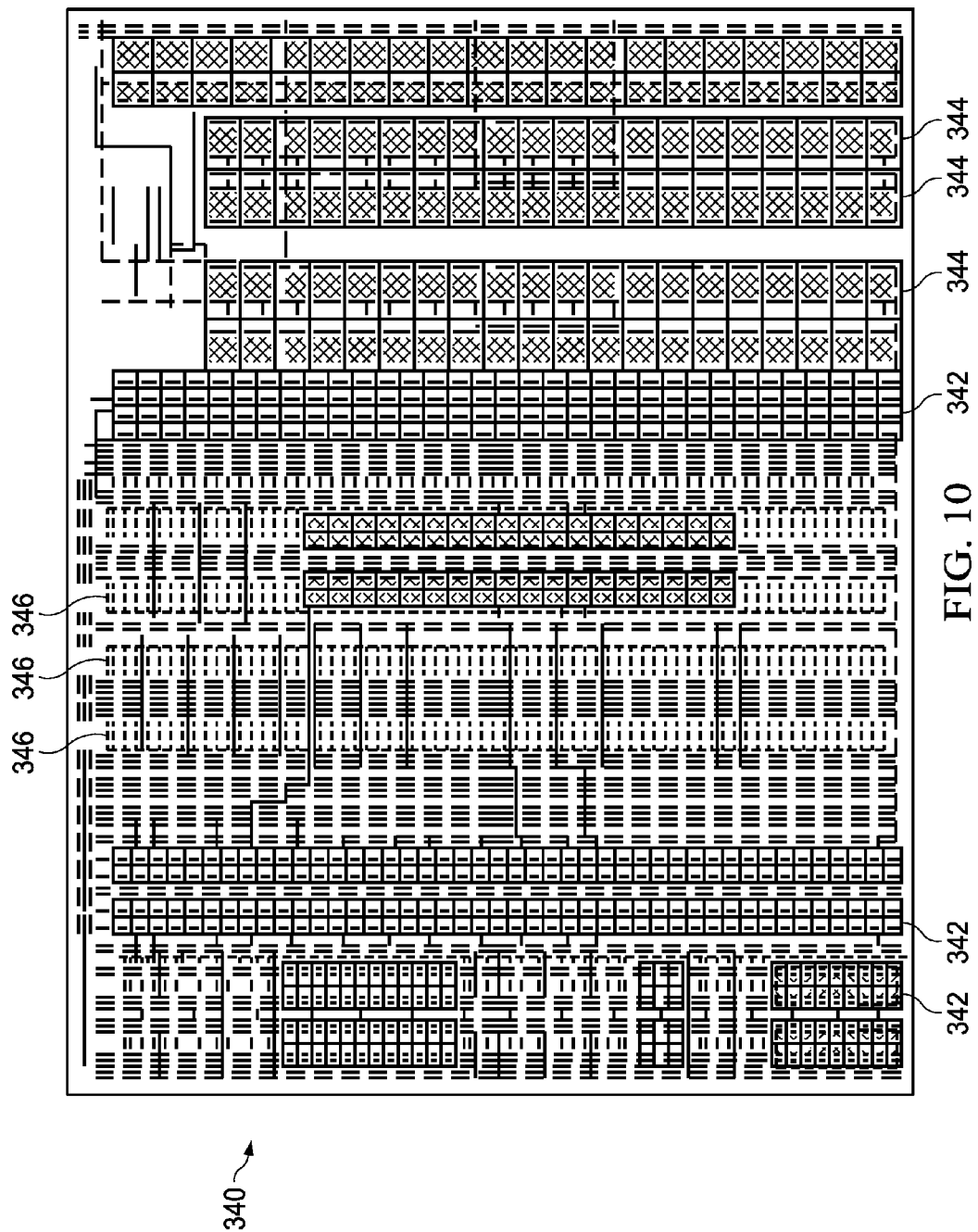
FIG. 10 illustrates an embodiment MOS and MIM capacitor layout.
Figure 11:
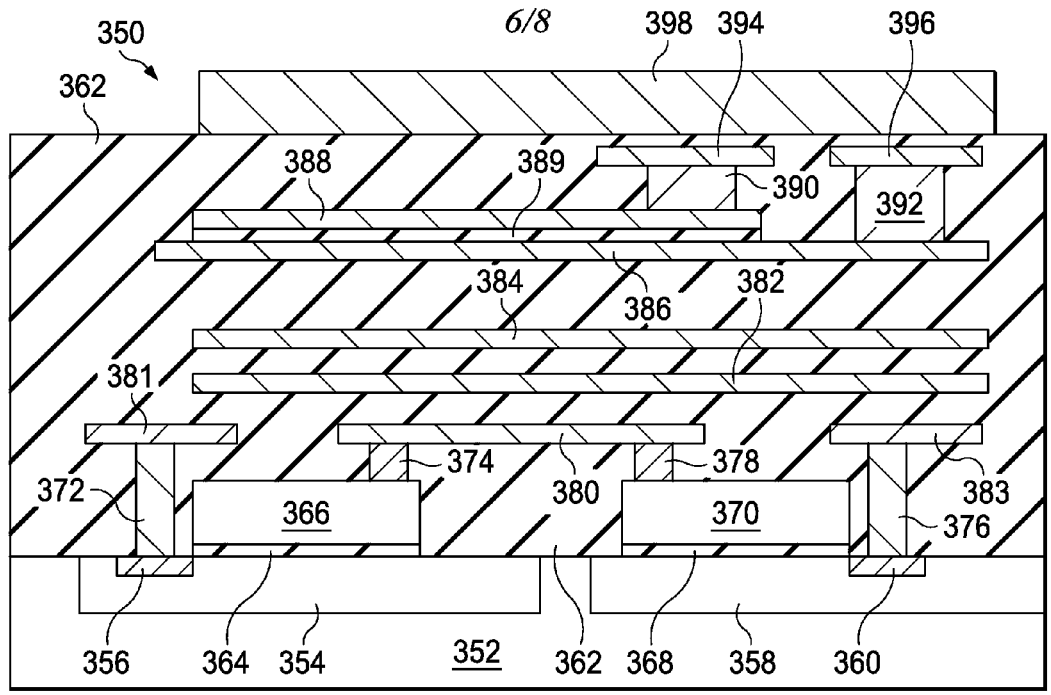
FIG. 11 illustrates an embodiment MOS and MIM capacitor integrated circuit.

In an example, the MIM capacitors are physically located above the MOS capacitors and the active devices, saving additional area on the die. Because the MIM capacitors are close to the top of the stack, they have very little interaction with the MOS capacitors or the active circuitry below. FIG. 10 illustrates layout 340 which contains MIM capacitors 342 over MOS capacitors 346 and switches 344. FIG. 11 illustrates a cross sectional view of integrated circuit 350 containing MIM capacitors above MOS capacitors. Substrate 352 contains MOS capacitor bottom plates 354 and 358, which may be n-wells. Oxide layer 364 is on MOS capacitor bottom plate 354, and oxide layer 368 is on MOS capacitor bottom plate 358. MOS capacitor top plate 366 is on oxide layer 364, and MOS capacitor top plate 370 is on oxide layer 368. In an example MOS capacitor top plate 366 and MOS capacitor top plate 370 are gate polysilicon layers. Also, via 374 connects MOS capacitor top plate 366 to metal interconnect layer 380, while via 378 connects MOS capacitor top plate 370 to metal interconnect layer 380. Contact layer 356 is embedded in MOS capacitor bottom plate 354 and contact layer 360 is embedded in MOS capacitor bottom plate 358. Additionally, via 372 connects contact layer 356 and metal interconnect layer 381, and via 376 connects contact layer 360 and metal interconnect layer 383. Also, metal interconnect layer 382 and metal interconnect layer 384 are above metal interconnect layer 380. Additionally, a dielectric layer 362, such as silicon dioxide, is between the various layers. Above these metal interconnect layers is MIM capacitor bottom plate 386. Insulating layer 389, which may be silicon dioxide or another dielectric, such as hafnium dioxide, is disposed between MIM capacitor bottom plate 386 and MIM capacitor top plate 388. Via 392 connects MIM capacitor bottom plate 386 and metal interconnect layer 396, and via 390 connects MIM capacitor top plate 388 and metal interconnect layer 394. Above dielectric layer 362 is ultra-thick metal layer 398.

Figure 12:
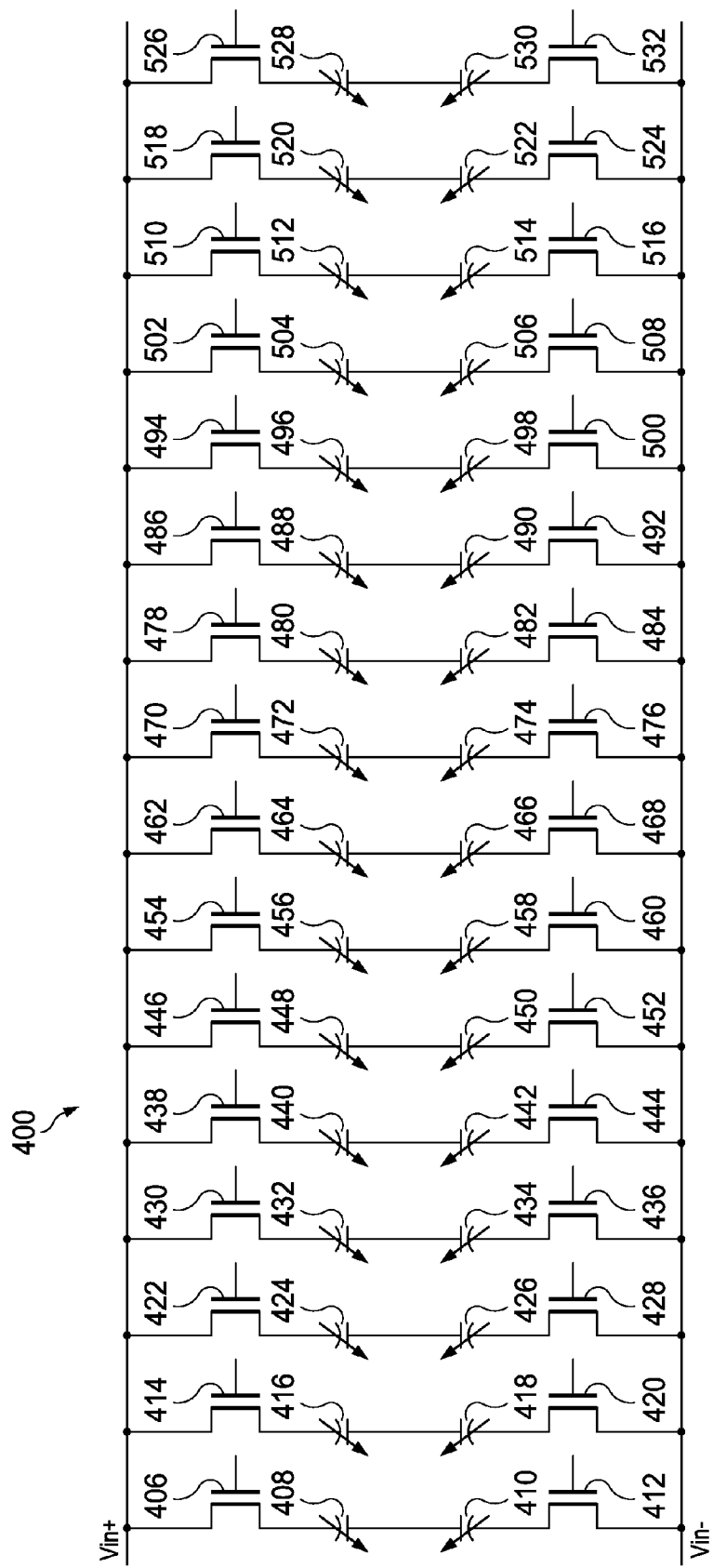
FIG. 12 illustrates an additional embodiment MOS capacitor circuit.

FIG. 12 illustrates circuit 400 which contains an array of MOS capacitors that may be used to implement the real pole at the input of the filter (capacitor 136 in FIG. 2) where a differential signal is applied across the adjustable capacitor. In the particular case of two filters with very close bandwidth, such as an LTE-10 filter, which has a bandwidth of 5 MHz, and a 3G2C filter, which has a bandwidth of 5.3 MHz, we need to use a new approach. Because these frequencies are very close, Clsb is very small, for example 0.02741*CFix. In circuit 400, only one branch is connected at a time. The capacitors are implemented as back-to-back MOS capacitors. A bias block at the junction between the back-to-back pairs of MOS capacitors has been omitted for clarity. In an example, capacitors 408 and 410 have a capacitance of Cfix and are controlled by switches 406 and 412, capacitors 416 and 418 have a capacitance of Cfix+Clsb and are controlled by switches 414 and 420, capacitors 424 and 426 have a capacitance of Cfix+2*Clsb and are controlled by switches 422 and 428, capacitors 432 and 434 have a capacitance of Cfix+3*Clsb and are controlled by switches 430 and 436, capacitors 440 and 442 have a capacitance of Cfix+4*Clsb and are controlled by switches 438 and 444, capacitor 448 and capacitor 450 have a capacitance of Cfix+5*Clsb and are controlled by switches 446 and 452, capacitors 456 and 458 have a capacitance of Cfix+6*Clsb and are controlled by switches 454 and 460, capacitors 464 and 466 have a capacitance of Cfix+7*Clsb and are controlled by switches 462 and 468, capacitors 472 and 474 have a capacitance of Cfix+8*Clsb and are controlled by switches 470 and 476, switches 480 and 482 have a capacitance of Cfix+9*Clsb and are controlled by switches 478 and 484, capacitors 488 and 490 have a capacitance of Cfix+10*Clsb and are controlled by switches 486 and 492, capacitors 496 and 498 have a capacitance of Cfix+11*Clsb and are controlled by switches 494 and 500, capacitors 504 and 506 have a capacitance of Cfix+12*Clsb and are controlled by switches 502 and 508, capacitors 512 and 514 have a capacitance of Cfix+13*Clsb and are controlled by switches 510 and 516, capacitors 520 and 522 have a capacitance of Cfix+14*Clsb and are controlled by switches 518 and 524, and capacitors 528 and 530 have a capacitance of Cfix+15*Clsb and are controlled by switches 526 and 532. As an example, the value of Cfix can be as low as 1 pF and so with a traditional binary tuning array we would end up with an LSB for a 4-bit tuning word of 62.5 fF, which is very close to the parasitic capacitance of the switches, thus problematic to implement accurately.

To adjust the two types of capacitors, a circuit including a tracking oscillator will provide two distinct control words, one for the MIM capacitor branches and the other for the MOS capacitor branches. This circuit is essentially a phase-locked loop (PLL), which locks the frequency of an RC oscillator to an accurate external frequency, normally in the order of several MHz, by adjusting the adjustable capacitor in the oscillator. Since this adjustable capacitor inside the oscillator uses the same topology as the one used in the filter, the filter is also tuned as the RC oscillator is tuned. In one embodiment two separate tracking oscillators are used, where one tracking circuit controls the MIM capacitors, and the other tracking circuit controls the MOS capacitors, so branches using either type of capacitor may be accurately tuned. The code may be digitally stored and presented to the appropriate capacitors.

Figure 13:
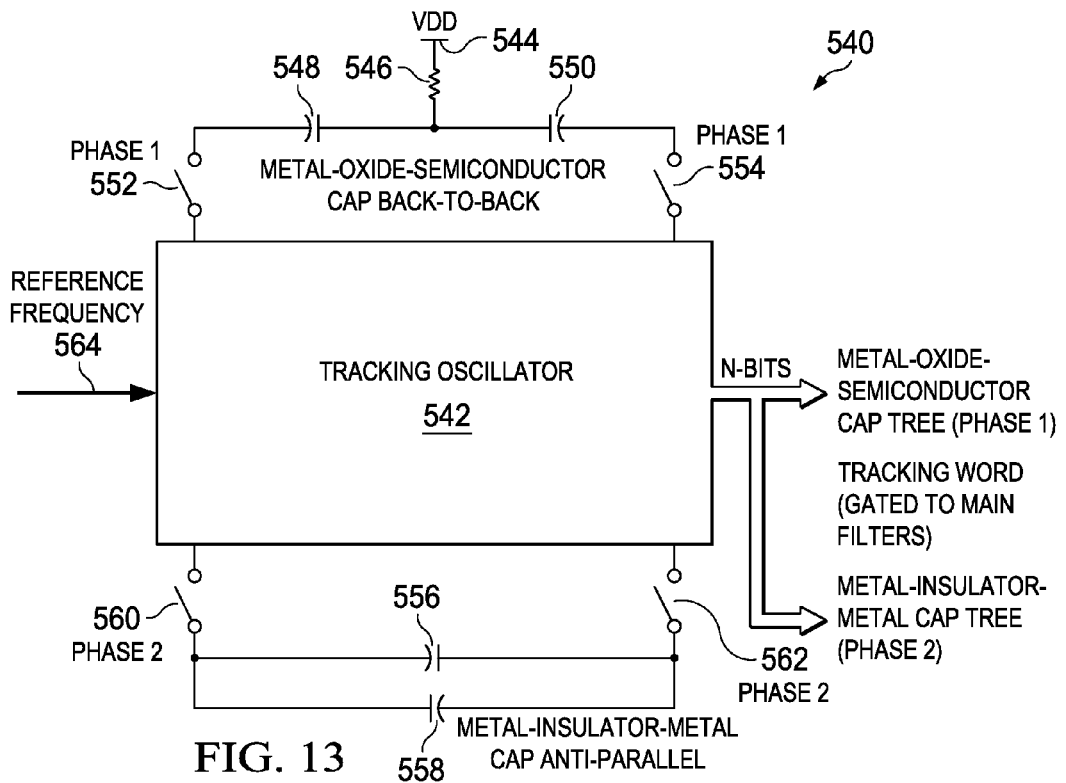
FIG. 13 illustrates an embodiment tracking oscillator circuit.

Alternatively, a single tracking oscillator may be used to control the MIM capacitors and the MOS capacitors. FIG. 13 illustrates circuit 540 which contains a single tracking oscillator that controls the MOS capacitors and the MIM capacitors. Tracking oscillator 542 receives reference frequency 564. Switch 552 and switch 554 connect back-to-back MOS capacitors 548 and 550 to tracking oscillator 542. Also, resistor 546 connects the center of MOS capacitors 548 and 550 to supply voltage 544. Additionally, switches 560 and 562 connect anti-parallel MIM capacitors 556 and 558 to tracking oscillator 542. N-bits are read out, which go to the MOS capacitor tree in phase 1 and the MIM capacitor tree in phase 2. The operation is similar to the two tracking oscillator case. The two types of capacitors are interleaved in time. During phase 2 in FIG. 13 the MIM capacitor tree is switched in for several reference frequency periods and tuned. Then, afterwards, the MOS capacitors are switched in during phase 1 and the MOS capacitors are tuned. Both binary words are stored in registers, so they are always available for the filter no matter which type of capacitor is being calibrated at any given time. The width of the control words would depend on the accuracy of the filter. For a more accurate response, more steps, more bits, and thus more capacitors in are needed.

Figure 14:
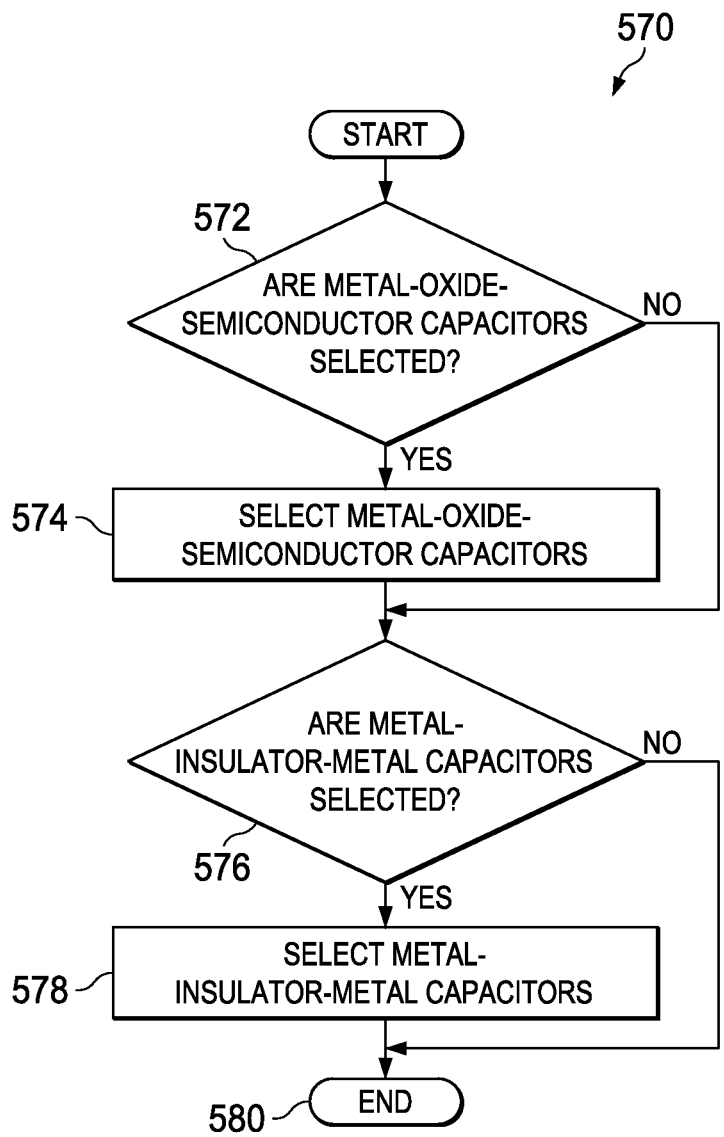
FIG. 14 illustrates an embodiment method of selecting capacitors.

FIG. 14 illustrates flowchart 570 showing a method for selecting capacitors from a capacitor bank that may contain both MOS capacitors and MIM capacitors. Initially, in step 572, it is determined if MOS capacitors are selected. When MOS capacitors are selected, in step 574, one or more MOS capacitor is selected. The decision to select the MOS capacitors connected is determined by the tracking oscillator binary word. The tracking oscillator, essentially a PLL, operates in a closed loop, and will try to adjust the adjustable capacitor inside an RC oscillator until the frequency of the RC oscillator locks with a stable reference frequency. When MOS capacitors are not selected in step 572, or after MOS capacitors are selected in step 574, it is determined if MIM capacitors are selected in step 576. Only MOS capacitors may be selected, only MIM capacitors may be selected, or both MOS capacitors and MIM capacitors are selected. If MIM capacitors are not selected in step 576, the method ends in step 580.

If MIM capacitors are selected in step 576, one or more MIM capacitor is selected in step 578. Then, the method ends in step 580.

An advantage of an embodiment includes a small die area for a circuit containing both MOS and MIM capacitors. Also, an embodiment enables accurate filter corner implementation.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An integrated circuit comprising:
   a first capacitive element comprising a first metal-oxide-semiconductor (MOS) capacitor;
   a second capacitive element coupled in parallel with the first capacitive element, wherein the second capacitive element comprises
      a second MOS capacitor, and
      a third MOS capacitor coupled in series with the second MOS capacitor;
   a third capacitive element coupled in parallel with the first capacitive element and the second capacitive element, wherein the third capacitive element comprises a first metal-insulator-metal (MIM) capacitor; and
   a fourth capacitive element coupled in parallel with the first capacitive element, the second capacitive element, and the third capacitive element, wherein the fourth capacitive element comprises a second MIM capacitor.

2. The integrated circuit of claim 1, wherein the second capacitive element further comprises a first switch coupled in series with the second MOS capacitor, and wherein the fourth capacitive element further comprises a second switch coupled in series with the second MIM capacitor.

3. The integrated circuit of claim 2, wherein the first capacitive element further comprises a third switch coupled in series with the first MOS capacitor, and wherein the third capacitive element further comprises a fourth switch coupled in series with the first MIM capacitor.

4. The integrated circuit of claim 1, wherein the first capacitive element has a first capacitive value, wherein the second capacitive element has a second capacitive value, and wherein the integrated circuit further comprises:
   a fifth capacitive element coupled in parallel with the first capacitive element and with the second capacitive element, wherein the fifth capacitive element has a first capacitance of a first multiple of the second capacitive value; and a sixth capacitive element coupled in parallel with the first capacitive element, with the second capacitive element, and with the fifth capacitive element, wherein the sixth capacitive element has a fourth capacitance of a second multiple of the second capacitive value.

5. The integrated circuit of claim 4, wherein the first multiple is two, and wherein the second multiple is four.

6. The integrated circuit of claim 1, wherein the integrated circuit further comprises:
   a first plurality of capacitive elements comprising a plurality of MOS capacitors, wherein the first plurality of capacitive elements is coupled in parallel with the first capacitive element, with the second capacitive element, with the third capacitive element, and with the fourth capacitive element; and
   a second plurality of capacitive elements comprising a plurality of MIM capacitors, wherein the second plurality of capacitive elements is coupled in parallel with the first capacitive element, with the second capacitive element, with the third capacitive element, with the fourth capacitive element, and with the first plurality of capacitive elements.

7. The integrated circuit of claim 1, wherein the first MOS capacitor comprises a first NMOS capacitor comprising a first body and a first gate, wherein the first capacitive element further comprises a second NMOS capacitor coupled in series with the first NMOS capacitor, wherein the second NMOS capacitor comprises a second body and a second gate, and wherein the first gate of the first NMOS capacitor is coupled to the second gate of the second NMOS capacitor.

8. The integrated circuit of claim 1, wherein the third capacitive element further comprises:
   a third MIM capacitor coupled anti-parallel to the first MIM capacitor; and
   a first switch coupled to a first node of the anti-parallel first and third MIM capacitors.

9. The integrated circuit of claim 8, wherein the third capacitive element further comprises a second switch coupled to a second node of the anti-parallel first and third MIM capacitors.

10. The integrated circuit of claim 1, wherein the integrated circuit further comprises:
    a semiconductor substrate, wherein the first capacitive element and the second capacitive element are disposed at a surface of the semiconductor substrate; and
    a metal interconnect layer, wherein the third capacitive element and the fourth capacitive element are disposed in the metal interconnect layer.

11. The integrated circuit of claim 1, wherein the first capacitive element has a first capacitance of a first capacitive value, wherein the second capacitive element has a second capacitance of the first capacitive value plus a second capacitive value, and wherein the integrated circuit further comprises:
    a fifth capacitive element coupled in parallel with the first capacitive element and with the second capacitive element, wherein the fifth capacitive element has a third capacitance of the first capacitive value plus a first multiple of the second capacitive value; and
    a sixth capacitive element coupled in parallel with the first capacitive element, with the second capacitive element, and with the fifth capacitive element, wherein the sixth capacitive element has a fourth capacitance of the first capacitive value plus a second multiple of the second capacitive value.

12. The integrated circuit of claim 11, wherein the first multiple is two, and wherein the second multiple is three.

13. The integrated circuit of claim 1, wherein the integrated circuit further comprises:
    a first tracking oscillator configured to generate a first selection code for the first and second capacitive elements; and
    a second tracking oscillator configured to generate a second selection code for the third and fourth capacitive elements.

14. The integrated circuit of claim 1, wherein the integrated circuit further comprises a tracking oscillator configured to generate a first selection code for first and second capacitive elements and to generate a second selection code for the third and fourth capacitive elements, wherein the first selection code and the second selection code are interleaved in time.

15. A circuit comprising:
    a first op-amp comprising a first input, a second input, and a first output, wherein the first input is coupled to a first node, wherein the second input is coupled to a second node and wherein the first output is coupled to a third node;
    a first resistor coupled to the first node and to a fourth node;
    a first capacitive element coupled to the fourth node and to a fifth node, wherein the first capacitive element comprises
        a second capacitive element comprising a first MOS capacitor, and
        a third capacitive element comprising a first MIM capacitor, wherein the third capacitive element is coupled in parallel with the second capacitive element;
    a fourth capacitive element coupled to the first node and to the third node, wherein the fourth capacitive element comprises
        a fifth capacitive element comprising a second MOS capacitor, and
        a sixth capacitive element comprising a second MIM capacitor, wherein the sixth capacitive element is coupled in parallel with the fifth capacitive element;
    a second resistor coupled to the third node and to a sixth node;
    a second op-amp comprising a third input coupled to the sixth node, a fourth input coupled to a seventh node, and a second output coupled to an eighth node; and
    a seventh capacitive element coupled to the sixth node and to the eighth node, wherein the seventh capacitive element comprises
        an eighth capacitive element comprising a third MOS capacitor coupled in series with a fourth MOS capacitor, and
        a ninth capacitive element coupled in parallel with the eighth capacitive element.

16. The circuit of claim 15, further comprising:
    a third resistor coupled to the eighth node and to a ninth node;
    a third op-amp comprising a fifth input coupled to the ninth node and a third output coupled to a tenth node;
    a fourth resistor coupled to the ninth node and to the tenth node;
    a fifth resistor coupled to the tenth node and to the first node; and
    a sixth resistor coupled to the first node and to the third node.

17. The circuit of claim 15, wherein the first op-amp comprises a first fully differential op-amp, wherein the first op-amp further comprises a third output coupled to a ninth node, and wherein the second op-amp comprises a second fully differential op-amp, wherein the second op-amp further comprises a fourth output coupled to a tenth node.

18. The circuit of claim 17, further comprising:
   a third resistor coupled to the ninth node and to the seventh node;
   a fourth resistor coupled to the second node and to the eighth node; and
   a fifth resistor coupled to the first node and to the tenth node.

19. The circuit of claim 17, further comprising:
   a tenth capacitive element coupled to the tenth node and to the seventh node, wherein the tenth capacitive element comprises
      an eleventh capacitive element comprising a fifth MOS capacitor,
      a twelfth capacitive element comprising a third MIM capacitor, wherein the twelfth capacitive element is coupled in parallel to the eleventh capacitive element fourth; and
   a thirteenth capacitive element coupled to the ninth node and to the second node, wherein the thirteenth capacitive element comprises
      a fourteenth capacitive element comprising a sixth MOS capacitor, and
      a fifteenth capacitive element comprising a fourth MIM capacitor, wherein the fifteenth capacitive element is coupled in parallel to the fourteenth capacitive element; and
   a third resistor coupled to the fifth node and to the second node.

* * * * *